(12) United States Patent
Urakawa

(10) Patent No.: US 12,211,678 B2
(45) Date of Patent: Jan. 28, 2025

(54) RECIPE UPDATING METHOD

(71) Applicant: TOKYO ELECTRON LIMITED, Tokyo (JP)

(72) Inventor: Masafumi Urakawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 612 days.

(21) Appl. No.: 17/517,253

(22) Filed: Nov. 2, 2021

(65) Prior Publication Data

US 2022/0137603 A1 May 5, 2022

(30) Foreign Application Priority Data

Nov. 2, 2020 (JP) .................................. 2020-183470

(51) Int. Cl.
*H01J 37/32* (2006.01)
*H01J 37/34* (2006.01)

(52) U.S. Cl.
CPC .... *H01J 37/3299* (2013.01); *H01J 37/32724* (2013.01); *H01J 37/32935* (2013.01); *H01J 37/3497* (2013.01); *G05B 2219/2602* (2013.01)

(58) Field of Classification Search
CPC ............. H01J 37/3299; H01J 37/32724; H01J 37/32935; H01J 37/3497; G05B 2219/2602; G05B 2219/45031; G05B 19/404; G05B 2219/49057; H01L 21/67103; H01L 21/67248; H01L 21/6831; H01L 21/67276
See application file for complete search history.

(56) References Cited

U.S. PATENT DOCUMENTS

| 2013/0310960 A1* | 11/2013 | Chang .............. G05B 19/41865 707/E17.014 |
| 2014/0256066 A1* | 9/2014 | Sato ..................... H01L 21/3065 156/345.28 |
| 2015/0348854 A1* | 12/2015 | Kapoor ............. H01J 37/32935 438/10 |
| 2016/0378092 A1* | 12/2016 | Yamamoto ........... G05B 19/404 700/300 |

(Continued)

FOREIGN PATENT DOCUMENTS

| CN | 116888720 A | * 10/2023 | ............. G03F 7/162 |
| JP | 2017-011169 A | 1/2017 | |

(Continued)

*Primary Examiner* — Jeffrie R Lund
(74) *Attorney, Agent, or Firm* — XSENSUS LLP

(57) ABSTRACT

A recipe updating method of a plasma processing apparatus includes: performing a plasma processing on a substrate mounted on a stage using a first recipe including an application timing of a radio-frequency power for plasma generation; measuring a reference timing at which a temperature of the stage drops to a minimum value and a first maximum value of the temperature of the stage in association with the first recipe; performing the plasma processing on the substrate using a second recipe obtained by changing the application timing of the first recipe to the reference timing; measuring a second maximum value of the temperature of the stage in association with the second recipe; and updating the first recipe to the second recipe when the second maximum value is smaller than the first maximum value.

10 Claims, 3 Drawing Sheets

(56) References Cited

U.S. PATENT DOCUMENTS

| | | | | |
|---|---|---|---|---|
| 2022/0137603 | A1* | 5/2022 | Urakawa | H01L 21/67248 |
| | | | | 700/97 |
| 2022/0392748 | A1* | 12/2022 | Kaijima | H01J 37/3244 |
| 2023/0162956 | A1* | 5/2023 | Koiwa | H01L 21/67103 |
| | | | | 438/798 |
| 2024/0274412 | A1* | 8/2024 | Oka | H01J 37/32642 |

FOREIGN PATENT DOCUMENTS

| | | | | | |
|---|---|---|---|---|---|
| KR | 20080035975 | A | * | 4/2008 | |
| KR | 2023161349 | A | * | 11/2023 | G05B 19/042 |
| WO | WO-2020059478 | A1 | * | 3/2020 | G05B 19/41875 |
| WO | WO-2021059900 | A1 | * | 4/2021 | G05B 19/4155 |
| WO | WO-2024162287 | A1 | * | 8/2024 | |

* cited by examiner

RECIPE UPDATING METHOD

CROSS-REFERENCE TO RELATED APPLICATIONS

This application is based on and claims priority from Japanese Patent Application No. 2020-183470 filed on Nov. 2, 2020 with the Japan Patent Office, the disclosure of which is incorporated herein in its entirety by reference.

TECHNICAL FIELD

The present disclosure relates to a recipe updating method.

BACKGROUND

In the related art, a technique has been known in which a plasma processing is performed on a substrate mounted on a stage by applying a radio-frequency power to the stage on which the substrate such as a semiconductor wafer is mounted to generate plasma. See, for example, Japanese Patent Laid-Open Publication No. 2017-011169.

SUMMARY

A recipe updating method according to as aspect of the present disclosure includes: performing a plasma processing on a substrate mounted on a stage using a first recipe including an application timing of a radio-frequency power for plasma generation; measuring a reference timing at which a temperature of the stage drops to a minimum value and a first maximum value of the temperature of the stage in association with the first recipe; performing the plasma processing on the substrate using a second recipe obtained by changing the application timing of the first recipe to the reference timing; measuring a second maximum value of the temperature of the stage in association with the second recipe; and updating the first recipe to the second recipe when the second maximum value is smaller than the first maximum value.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described in detail with reference drawings. Further, the present disclosure is not limited to the following embodiments.

When a plasma processing is performed on a substrate mounted on a stage, the temperature of the stage is adjusted to a set temperature during an interruption period between steps of generating plasma, and when reaching an application timing, a radio-frequency power for plasma generation is applied to the stage. As a result, the stage adjusted to the set temperature is heated by the plasma generated at the application timing, and consequently, overshoot occurs in which the temperature of the stage rises significantly from the set temperature. When the overshoot occurs after the application of the radio-frequency power, it takes a long time for stabilizing the temperature of the stage to the set temperature again.

Therefore, it is expected to shorten the time until the temperature of the stage is stabilized after the application of the radio-frequency power.

(Example of Flow of Recipe Updating Method of Plasma Processing Apparatus according to Embodiment)

Figure 1:
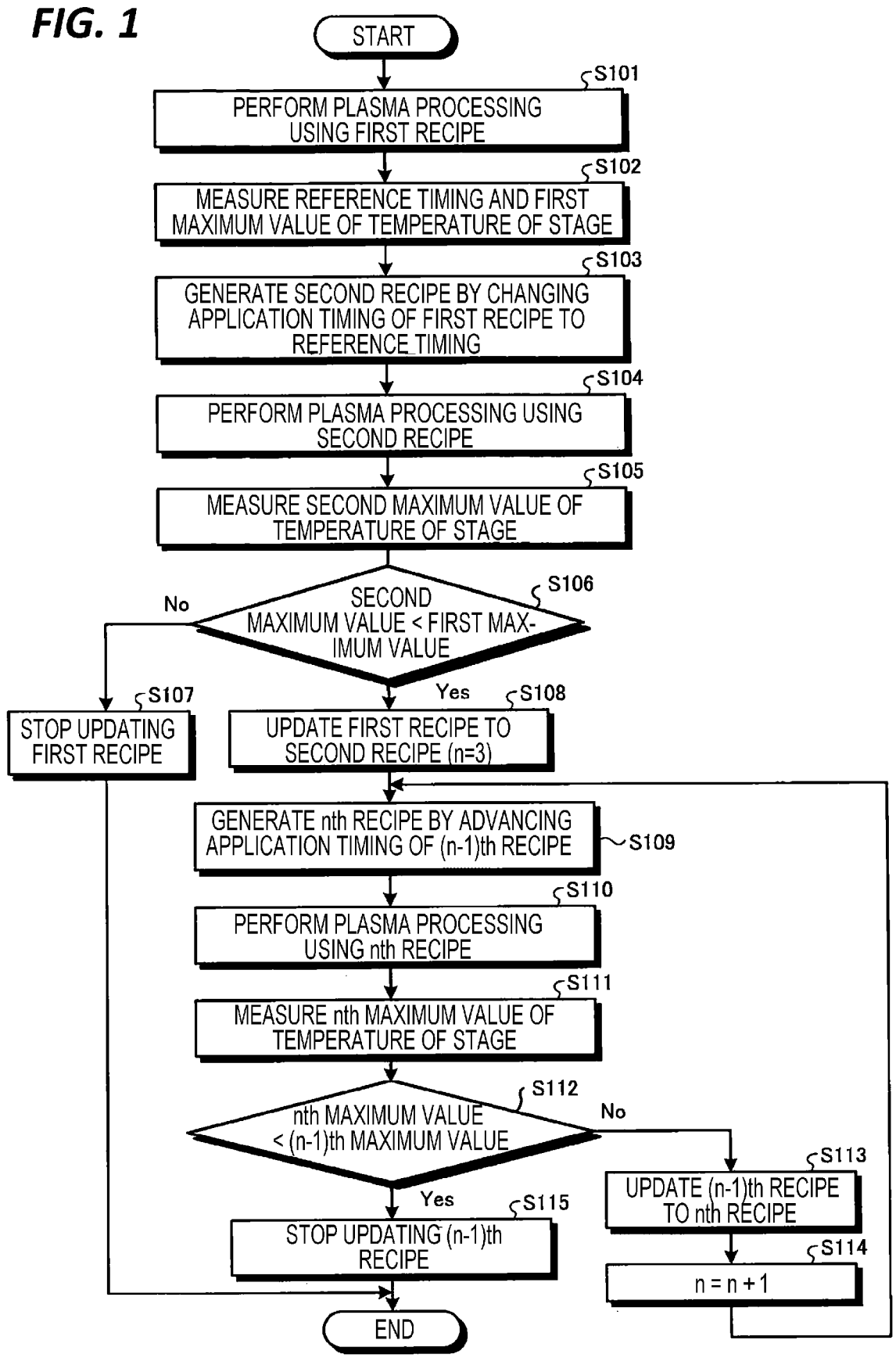
FIG. 1 is a flowchart illustrating an example of a flow of a recipe updating method of a plasma processing apparatus according to an embodiment.

FIG. 1 is a flowchart illustrating an example of a flow of a recipe updating method of a plasma processing apparatus according to an embodiment. In the recipe updating method according to the embodiment, a recipe including an application timing of a radio-frequency power for plasma generation is updated, and thus, the time until the temperature of the stage on which a substrate is mounted is stabilized is shortened.

First, a plasma processing is performed on a substrate mounted on a stage using a first recipe including an application timing of a radio-frequency power for plasma generation (step S101). The first recipe is stored in, for example, a storage unit included in the plasma processing apparatus. The plasma processing performed on the substrate is constituted by a plurality of steps of generating plasma and interruption periods in which plasma is not generated between steps. In the interruption periods, the temperature of the stage drops from a set temperature due to heat removal caused by disappearance of the plasma. In the interruption periods, the temperature of the stage is adjusted to the set temperature by, for example, using a heater provided in the stage. The application timing of the first recipe is set to, for example, a timing to start the next step of the interruption period.

Next, a "reference timing" at which the temperature of the stage drops to a minimum value and a "first maximum value" of the temperature of the stage are measured in association with the first recipe (step S102). The reference timing is included in the interruption period. The stage is heated by the plasma generated at the application timing of the radio-frequency power, and thus, the temperature of the stage rises to the first maximum value. The temperature of the stage rises to the first maximum value corresponding to the first recipe.

Next, a second recipe is generated by changing the application timing of the first recipe to the reference timing (step S103).

Next, the plasma processing is performed on the substrate mounted on the stage by using the second recipe (step S104). Since the application timing of the second recipe coincides with the reference timing at which the temperature of the stage drops to the minimum value, overshoot in which the temperature of the stage rises significantly from the set temperature may be suppressed.

Next, a "second maximum value" of the temperature of the stage is measured in association with the second recipe (step S105). The stage is heated by the plasma generated at the application timing of the radio-frequency power, and thus, the temperature of the stage rises to the second maximum value. The temperature of the stage rises to the second maximum value corresponding to the second recipe.

Next, it is determined whether the second maximum value is smaller than the first maximum value (step S106). When it is determined that the second maximum value is equal to or greater than the first maximum value (No in step S106), the updating of the first recipe is stopped (step S107), and the processing ends.

Meanwhile, when it is determined that the second maximum value is smaller than the first maximum value (Yes in step S106), the first recipe is updated to the second recipe (step S108). The maximum value of the temperature of the stage may further be reduced by further advancing the application timing of the second recipe from the reference timing. As a result, thereafter, a processing that generates another recipe having an application timing earlier than that of the second recipe is repeated. In FIG. 1, a variable that identifies another recipe different from the second recipe is indicated by "n" (n is a natural number of 3 or more), and "n=3" is set when updating the first recipe in step S108).

After the step of updating the first recipe (step S108), an application timing of a (n−1)th recipe is advanced to generate an nth recipe (step S109). For example, a third recipe is generated by advancing the application timing of the second recipe from the reference timing by a predetermined time.

Next, the plasma processing is performed on the substrate mounted on the stage by using the nth recipe (step S110). Since the application timing of the nth recipe is earlier than the reference timing at which the temperature of the stage drops to the minimum value, overshoot in which the temperature of the stage rises significantly from the set temperature may be suppressed.

Next, an "nth maximum value" of the temperature of the stage is measured in association with the nth recipe (step S111). The stage is heated by the plasma generated at the application timing of the radio-frequency power, and thus, the temperature of the stage rises to the nth maximum value. The temperature of the stage rises to the nth maximum value corresponding to the nth recipe. For example, the temperature of the stage rises to a third maximum value corresponding to the third recipe.

Next, it is determined whether the nth maximum value is smaller than the (n−1)th maximum value measured in association with the (n−1)th recipe (step S112). For example, it is determined whether the third maximum value is smaller than the second maximum value. When it is determined that the nth maximum value is smaller than the (n−1)th maximum value (Yes in step S112), the (n−1)th recipe is updated to the nth recipe (step S113). For example, the second recipe is updated to the third recipe. The maximum value of the temperature of the stage may further be reduced by advancing the application timing of the nth recipe. As a result, after the step of updating the (n−1)th recipe (step S113), the variable n is updated (n=n+1, step S114) and the processing is returned to step S109 to generate the nth recipe. For example, after updating the second recipe to the third recipe, a fourth recipe is generated by advancing the application timing of the third recipe by a predetermined time. When the fourth recipe is generated, the plasma processing is performed using the fourth recipe in step S110, and a fourth maximum value of the temperature of the stage is measured in association with the fourth recipe in step S111.

Thereafter, the processings of steps S109 to S114 are repeated until the nth maximum value becomes the (n−1)th maximum value or more. When the nth maximum value becomes the (n−1)th maximum value or more (No in step S112), the updating of the (n−1)th recipe is stopped, and the processing ends.

(Shortening of Stabilization Time of Temperature of Stage)

Figure 2:
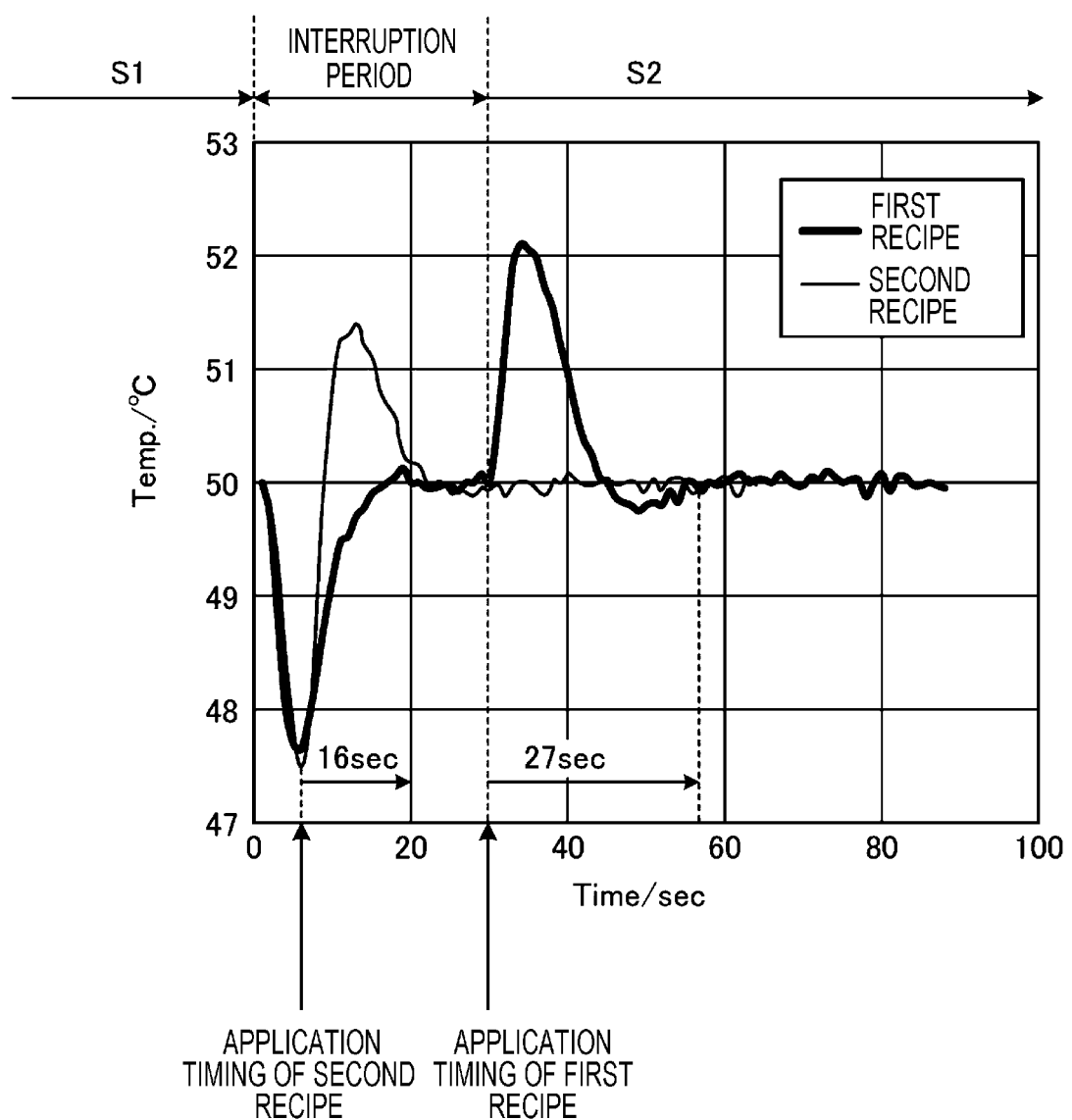
FIG. 2 is a view illustrating shortening of a stabilization time of a temperature of a stage by the recipe updating method according to the embodiment.

FIG. 2 is a view illustrating shortening of a stabilization time of the temperature of the stage by the recipe updating method according to the embodiment. FIG. 2 illustrates an experimental result when the first recipe is updated to the second recipe.

The "first recipe" in FIG. 2 illustrates the result of the performing the plasma processing on the substrate mounted on the stage using the first recipe. When using the first recipe, the temperature of the stage drops from a set temperature (e.g., 50° C.) in an interruption period between steps S1 and S2 in which plasma is generated, and after the application timing, the temperature of the stage rises to approximately 52° C., which is the first maximum value corresponding to the first recipe. The time until the temperature of the stage is stabilized again to the set temperature of 50° C. is 27 sec.

The "second recipe" in FIG. 2 illustrates the result of the performing the plasma processing on the substrate mounted on the stage using the second recipe. The application timing of the second recipe has changed to the reference timing at which the temperature of the stage drops to the minimum value. When using the second recipe, after the application timing, the temperature of the stage rises to approximately 51.4° C., which is the second maximum value corresponding to the second recipe. The time until the temperature of the stage is stabilized again to the set temperature of 50° C. is shortened to approximately 16 sec.

When performing the plasma processing according to the first recipe, the stage adjusted to the set temperature is heated by the plasma generated at the application timing. As a result, the temperature of the stage significantly rises from the set temperature, and thus, the first maximum value corresponding to the first recipe is increased. Meanwhile, when performing the plasma processing according to the second recipe, the reference timing at which the temperature of the stage drops to the minimum value and the application timing coincide with each other, and thus, the influence of heat input from the plasma generated at the application timing to the stage is suppressed. As a result, the temperature of the stage does not rise greatly with respect to the set temperature, and thus, the increase of the second maximum value corresponding to the second recipe is suppressed. As a result, the overshoot generated after the application of the radio-frequency power to the stage is suppressed, and the stabilization time of the temperature of the stage may be shortened.

(Example of Plasma Processing Apparatus)

Figure 3:
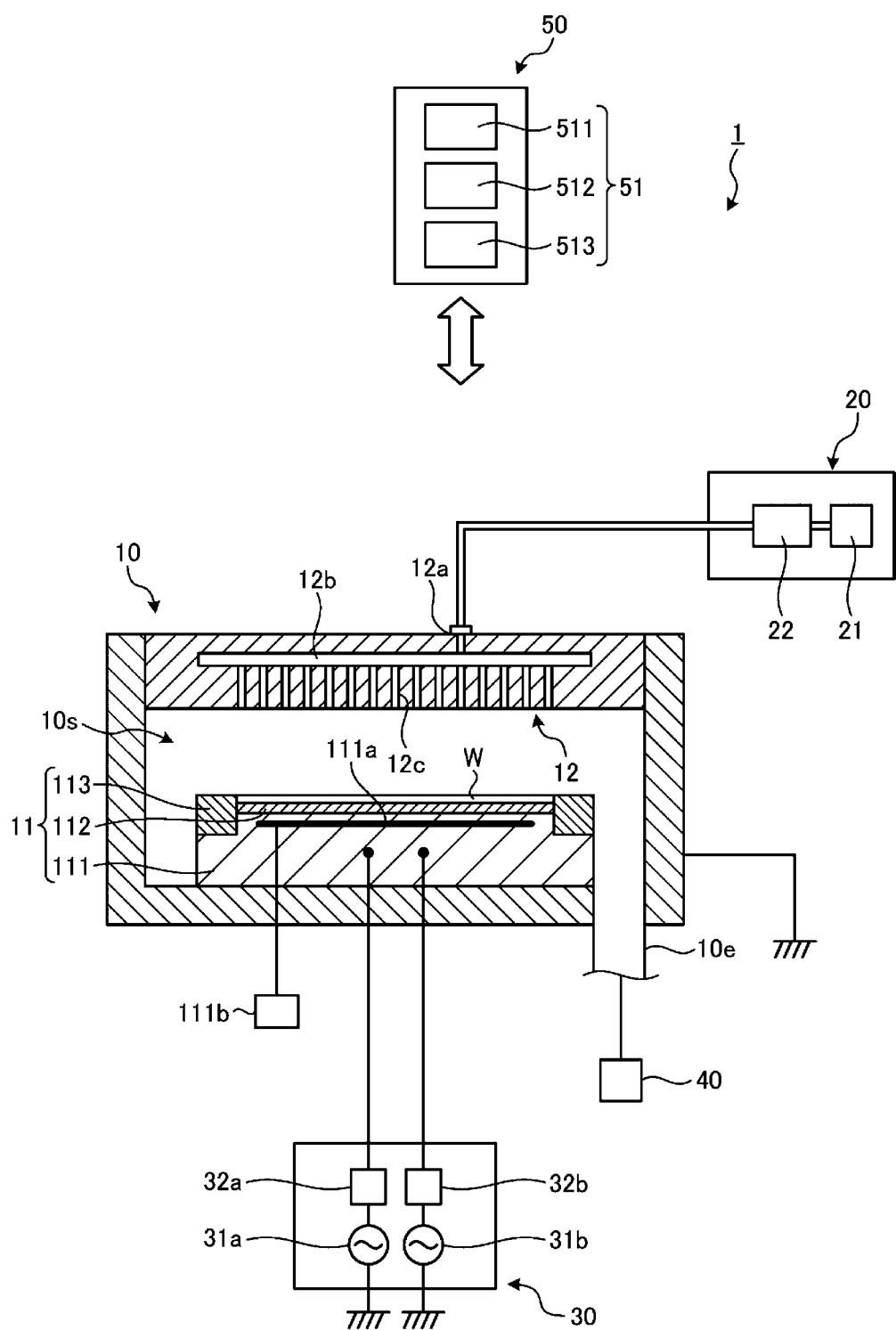
FIG. 3 is a view illustrating an example of a plasma processing apparatus used to perform the recipe updating method according to the embodiment.

FIG. 3 is a view illustrating an example of a plasma processing apparatus used to perform the recipe updating method according to the embodiment. A plasma processing apparatus 1 illustrated in FIG. 3 includes a chamber 10, a gas supply 20, a radio-frequency (RF) power supply 30, an exhaust system 40, and a controller 50.

In the embodiment, the chamber 10 includes a support 11 (also referred to as a stage) and an upper electrode shower head assembly 12. The support 11 is disposed in a lower area of a processing space 10s in the chamber 10. The upper electrode shower head assembly 12 is disposed above the support 11 and may function as a part of a ceiling plate of the chamber 10.

The support 11 is configured to support a substrate W in the processing space 10s. In the embodiment, the support 11 includes a lower electrode 111, an electrostatic chuck 112, and an edge ring 113. The electrostatic chuck 112 is disposed on the lower electrode 111, and is configured to support the substrate W on the upper surface of the electrostatic chuck 112. The edge ring 113 is disposed on the upper surface of the peripheral edge portion of the lower electrode 111 to surround the substrate W. A heater 111a is provided inside the support 11. The heater 111a is connected to a heater power supply 111b. The heater power supply 111b supplies an adjusted power to the heater 111a, under the control of the controller 50. Therefore, the heat generated by the heater 111a is controlled, and the temperature of the support 11 is adjusted.

The upper electrode shower head assembly 12 is configured to supply one or more processing gases from the gas supply 20 to the processing space 10s. In the embodiment, the upper electrode shower head assembly 12 includes a gas inlet 12a, a gas diffusion chamber 12b, and a plurality of gas outlets 12c. The gas inlet 12a is fluidically communicated with the gas supply 20 and the gas diffusion chamber 12b. The plurality of gas outlets 12c are fluidically communicated with the gas diffusion chamber 12b and the processing space 10s. In the embodiment, the upper electrode shower head assembly 12 is configured to supply one or more processing gases from the gas inlet 12a to the processing space 10s via the gas diffusion chamber 12b and the plurality of gas outlets 12c.

The gas supply 20 may include one or more gas sources 21 and one or more flow rate controllers 22. In the embodiment, the gas supply 20 is configured to supply one or more processing gases from the respective gas sources 21 to the gas inlet 12a via the respective flow rate controllers 22. The flow rate controller 22 may include, for example, a mass flow controller or a pressure-control type flow rate controller. Further, the gas supply 20 may include one or more flow rate modulation devices that modulate or pulse the flow rate of one or more processing gases.

The RF power supply 30 is configured to supply RF power, for example, one or more RF signals to one or more electrodes such as the lower electrode 111, or the upper electrode shower head assembly 12, or both the lower electrode 111 and the upper electrode shower head assembly 12. In the embodiment, the RF power supply 30 includes two RF generators 31a and 31b and two matching circuits 32a and 32b. The RF power supply 30 in the embodiment is configured to supply a first RF signal from the first RF generator 31a to the lower electrode 111 via the first matching circuit 32a. The RF spectrum includes a part of the electromagnetic spectrum in a range of 3 Hz to 3,000 GHz. With respect to an electronic material process such as a semiconductor process, the RF spectrum used for generating plasma may be within a range of 100 kHz to 3 GHz, and further, a range of 200 kHz to 150 MHz. For example, the first RF signal may have a frequency within a range of 27 MHz to 100 MHz. Further, the RF power supply 30 in the embodiment is configured to supply a second RF signal from the second RF generator 31b to the lower electrode 111 via the second matching circuit 32b. For example, the second RF signal may have a frequency within a range of 400 kHz to 13.56 MHz. Alternatively, a direct current (DC) pulse generator may be used instead of the second RF generator 31b. Moreover, although not illustrated, other embodiments are considered here. For example, in an alternative embodiment, the RF power supply 30 may be configured to supply the first RF signal from an RF generator to the lower electrode 111, supply the second RF signal from another RF generator to the lower electrode 111, and supply a third RF signal from the other RF generator to the lower electrode 111. In addition, in another alternative embodiment, a DC voltage may be applied to the upper electrode shower head assembly 12. Moreover, in various embodiments, the amplitude of one or more RF signals (i.e., first RF signal, second RF signal, etc.) may be pulsed or modulated. The amplitude modulation may include pulsing the RF signal amplitude between an ON state and an OFF state, or between two or more different ON states. The phase matching of the RF signal may be controlled, and the phase matching of the amplitude modulation of two or more RF signals may be synchronized or asynchronous.

The exhaust system 40 may be connected to, for example, an exhaust port 10e provided in a bottom portion of the chamber 10. The exhaust system 40 may include a pressure valve or a vacuum pump such as a turbo molecular pump, a roughing pump, or a combination thereof.

In the embodiment, the controller 50 processes computer-executable instructions that cause the plasma processing apparatus 1 to perform the various steps described herein. The controller 50 may be configured to control each element of the plasma processing apparatus 1 so as to execute the various steps described here. The controller 50 may include, for example, a computer 51. The computer 51 includes, for example, a processor (central processing unit: CPU) 511, a storage unit 512, and a communication interface 513. The processor 511 may be configured to perform various control operations based on a program stored in the storage unit 512. The storage unit may include at least one memory type selected from a group consisting of a random access memory (RAM), a read only memory (ROM), and an auxiliary storage device such as a hard disk drive (HDD) and a solid state drive (SSD). The communication interface 513 may communicate with the plasma processing apparatus 1 via a communication line such as a local area network (LAN).

Effect of Embodiment

The recipe updating method according to the embodiment is a recipe updating method of a plasma processing apparatus. The recipe updating method according to the embodiment includes the step of performing the plasma processing using the first recipe, the step of measuring the reference timing and the first maximum value, the step of performing the plasma processing using the second recipe, the step of measuring the second maximum value, and the step of updating the first recipe. In the step of performing the plasma processing using the first recipe, the plasma processing is performed on the substrate mounted on the stage using the first recipe including the application timing of the radio-frequency power for plasma generation. In the step of measuring the first maximum value, the reference timing at which the temperature of the stage drops to the minimum value and the first maximum value of the temperature of the stage are measured in association with the first recipe. In the step of performing the plasma processing using the second recipe, the plasma processing is performed on the substrate using the second recipe obtained by changing the application timing of the first recipe to the reference timing. In the step of measuring the second maximum value, the second maximum value of the temperature of the stage is measured in association with the second recipe. In the step of updating the first recipe, when the second maximum value is smaller than the first maximum value, the first recipe is updated to the second recipe. Therefore, according to the recipe updating method according to the embodiment, since the overshoot occurred after the application of the radio-frequency power to the stage may be suppressed, the time until the temperature of the stage is stabilized after the application of the radio-frequency power may be shortened.

Further, the recipe updating method according to the embodiment further includes the step of performing the plasma processing using the nth recipe (n is a natural number of 3 or more), the step of measuring the nth maximum value, and the step of updating the (n−1)th recipe. In the step of performing the plasma processing using the nth recipe, after the step of updating the first recipe, the plasma processing is performed on the substrate using the nth recipe obtained by advancing the application timing of the (n−1)th recipe. In the step of measuring the nth maximum value, the nth maximum value of the temperature of the stage is measured in association with the nth recipe. In the step of updating the (n−1)th recipe, when the nth maximum value is smaller than the (n−1)th maximum value measured in association with the (n−1)th recipe, the (n−1)th recipe is updated to the nth recipe. Therefore, according to the recipe updating method according to the embodiment, the maximum value of the temperature of the stage may further be reduced by further advancing the application timing of the second recipe, and the time until the temperature of the stage is stabilized may further be shortened.

Further, in the embodiment, the step of performing the plasma processing using the nth recipe, the step of measuring the nth maximum value, and the step of updating the (n−1)th recipe are repeated until the nth maximum value becomes the (n−1)th maximum value or more. Then, in the step of updating the (n−1)th recipe, the updating of the (n−1)th recipe is stopped when the nth maximum value becomes the (n−1)th maximum value or more. Therefore, according to the recipe updating method according to the embodiment, the maximum value of the temperature of the stage may be minimized, and the time until the temperature of the stage is stabilized may further be shortened.

For example, in the embodiment, the example in which the plasma processing is performed on the substrate on the stage using the second recipe obtained by changing the application timing of the first recipe to the reference timing has been described, but the disclosed technique is not limited thereto. For example, in the step of performing the plasma processing using the second recipe, when the application timing after the change has been reached, the power supplied to the heater provided in the stage may be temporarily reduced from the set power. Therefore, it is possible to suppress the temperature rise due to the heating of the heater when the radio-frequency power is applied to the stage, and thus, the time until the temperature of the stage is stabilized may further be shortened. Further, after the application timing, the power supplied to the heater may be returned to the set power when the temperature of the stage reaches the set temperature. Therefore, the temperature of the stage after the application of the radio-frequency power to the stage may be maintained to the set temperature.

According to the present disclosure, it is possible to shorten the time until the temperature of the stage is stabilized after the application of the radio-frequency power.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A recipe updating method comprising:
performing a plasma processing on a substrate mounted on a stage of a plasma processing apparatus using a first recipe including an application timing of a radio-frequency power for plasma generation;
measuring a reference timing at which a temperature of the stage drops to a minimum value and a first maximum value of the temperature of the stage in association with the first recipe;
performing the plasma processing on the substrate using a second recipe obtained by changing the application timing of the first recipe to the reference timing;
measuring a second maximum value of the temperature of the stage in association with the second recipe; and
updating the first recipe to the second recipe when the second maximum value is smaller than the first maximum value.

2. The recipe updating method according to claim 1, further comprising:
after the updating the first recipe, performing the plasma processing on the substrate using an nth recipe obtained by advancing the application timing of an (n−1)th recipe (n is a natural number of 3 or more);
measuring an nth maximum value of the temperature of the stage in association with the nth recipe; and
updating the (n−1)th recipe to the nth recipe when the nth maximum value is smaller than an (n−1)th maximum value measured in association with the (n−1)th recipe.

3. The recipe updating method according to claim 2, wherein the performing the plasma processing using the nth recipe, the measuring the nth maximum value, and the updating the (n−1)th recipe are repeated until the nth maximum value becomes the (n−1)th maximum value or more, and
in the updating the (n−1)th recipe, the updating of the (n−1)th recipe is stopped when the nth maximum value becomes the (n−1)th maximum value or more.

4. The recipe updating method according to claim 1, wherein, in the performing the plasma processing using the second recipe, a power supplied to a heater provided in the stage is reduced from a set power at the application timing.

5. The recipe updating method according to claim 4, wherein, in the performing the plasma processing using the second recipe, the power supplied to the heater is returned to the set power at a time when the temperature of the stage reaches a set temperature after the application timing.

6. A plasma processing apparatus comprising:
a processing chamber configured to perform a plasma processing;
a stage provided in the processing chamber and configured to mount a substrate;
a heater provided in the stage and configured to control temperature of the stage;
a gas supply configured to supply a processing gas from a gas source to the processing chamber;
a radio-frequency power supply configured to supply a radio-frequency power to an electrode; and
a controller configured to control an overall operation of the plasma processing apparatus,
wherein the controller is programmed to:

perform the plasma processing on the substrate mounted on the stage using a first recipe including an application timing of the radio-frequency power;

measure a reference timing at which a temperature of the stage drops to a minimum value and a first maximum value of the temperature of the stage in association with the first recipe;

perform the plasma processing on the substrate using a second recipe obtained by changing the application timing of the first recipe to the reference timing;

measure a second maximum value of the temperature of the stage in association with the second recipe; and update the first recipe to the second recipe when the second maximum value is smaller than the first maximum value.

7. The plasma processing apparatus according to claim 6, wherein the controller is further programmed to:

after updating the first recipe, perform the plasma processing on the substrate using an nth recipe obtained by advancing the application timing of an (n−1)th recipe (n is a natural number of 3 or more);

measure an nth maximum value of the temperature of the stage in association with the nth recipe; and update the (n−1)th recipe to the nth recipe when the nth maximum value is smaller than an (n−1)th maximum value measured in association with the (n−1)th recipe.

8. The plasma processing apparatus according to claim 7, wherein the performing the plasma processing using the nth recipe, the measuring the nth maximum value, and the updating the (n−1)th recipe are repeated until the nth maximum value becomes the (n−1)th maximum value or more, and the updating the (n−1)th recipe is stopped when the nth maximum value becomes the (n−1)th maximum value or more.

9. The plasma processing apparatus according to claim 6, wherein, when the plasma processing is performed using the second recipe, a power supplied to the heater provided in the stage is reduced from a set power at the application timing of the radio-frequency power.

10. The plasma processing apparatus according to claim 9, wherein, when the plasma processing is performed using the second recipe, the power supplied to the heater is returned to the set power at a time when the temperature of the stage reaches a set temperature after the application timing of the radio-frequency power.

* * * * *